(12) United States Patent
Lee et al.

(10) Patent No.: US 9,514,813 B2
(45) Date of Patent: Dec. 6, 2016

(54) RESISTIVE MEMORY DEVICE, RESISTIVE MEMORY SYSTEM, AND OPERATING METHOD THEREOF

(71) Applicant: SAMSUNG ELECTRONICS CO., LTD., Suwon-si, Gyeonggi-do (KR)

(72) Inventors: Yong-kyu Lee, Hwaseong-si (KR); Yeong-taek Lee, Seoul (KR); Dae-seok Byeon, Seongnam-si (KR); In-gyu Baek, Seoul (KR); Man Chang, Seoul (KR); Lijie Zhang, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/724,909

(22) Filed: May 29, 2015

(65) Prior Publication Data
US 2016/0099052 A1 Apr. 7, 2016

(30) Foreign Application Priority Data
Oct. 1, 2014 (KR) .......................... 10-2014-0132496

(51) Int. Cl.
| G11C 11/00 | (2006.01) |
| G11C 13/00 | (2006.01) |
| G11C 7/04 | (2006.01) |
| G11C 11/16 | (2006.01) |

(52) U.S. Cl.
CPC ............ *G11C 13/0069* (2013.01); *G11C 7/04* (2013.01); *G11C 11/1675* (2013.01); *G11C 13/0097* (2013.01); *G11C 2013/0073* (2013.01); *G11C 2013/0088* (2013.01); *G11C 2013/0092* (2013.01)

(58) Field of Classification Search
CPC ............ G11C 13/0069; G11C 13/0097; G11C 13/0064; G11C 13/0004; G11C 2013/0066; G11C 2013/0078
USPC .................................................. 365/148, 211
See application file for complete search history.

(56) References Cited

U.S. PATENT DOCUMENTS

| 7,447,092 B2 | 11/2008 | Cho et al. |
| 7,796,425 B2 | 9/2010 | Choi et al. |
| 7,898,840 B2 | 3/2011 | Maejima |
| 8,050,084 B2 | 11/2011 | Bae et al. |
| 8,149,611 B2 | 4/2012 | Maejima |
| 8,213,254 B2 | 7/2012 | Choi et al. |
| 8,228,709 B2 | 7/2012 | Choi |
| 8,331,183 B2 | 12/2012 | Lee et al. |
| 8,351,252 B2 | 1/2013 | Chung |
| 8,432,722 B2 | 4/2013 | Maejima |
| 8,437,171 B1 | 5/2013 | Gilbert |
| 8,526,226 B2 | 9/2013 | Lym et al. |

(Continued)

FOREIGN PATENT DOCUMENTS

KR 10-2010-0015195 A 2/2010

*Primary Examiner* — Toan Le
(74) *Attorney, Agent, or Firm* — Lee & Morse, P.C.

(57) ABSTRACT

A method for operating a memory device includes sensing a temperature of the resistive memory device, setting a level of a set voltage or current for writing to a memory cell based on the temperature, setting a level of a reset voltage for reset writing to the memory cell based on the temperature, and performing a write operation on the memory cell based on the level of the set voltage or current and the level of the reset voltage. The memory device may be a resistive memory device.

20 Claims, 12 Drawing Sheets

(56) References Cited

U.S. PATENT DOCUMENTS

| | | | |
|---|---|---|---|
| 8,531,892 B2 | 9/2013 | Yoon | |
| 8,559,218 B2 | 10/2013 | Porter et al. | |
| 2008/0068873 A1* | 3/2008 | Matsuno | G11C 11/22 365/145 |
| 2011/0063903 A1 | 3/2011 | Kang et al. | |
| 2015/0049536 A1* | 2/2015 | Oh | G11C 13/003 365/148 |
| 2015/0332764 A1* | 11/2015 | Cabout | G11C 13/0007 365/148 |
| 2015/0380086 A1* | 12/2015 | Park | G11C 13/0069 365/148 |

* cited by examiner

< Write_SET >

< Write_RESET >

< Write_SET >

< Write_SET >

RESISTIVE MEMORY DEVICE, RESISTIVE MEMORY SYSTEM, AND OPERATING METHOD THEREOF

CROSS-REFERENCE TO RELATED APPLICATION

Korean Patent Application No. 10-2014-0132496, filed on Oct. 1, 2014, and entitled: "Resistive Memory Device, Resistive Memory System, and Operating Method Thereof," is incorporated by reference herein in its entirety.

BACKGROUND

1. Field

One or more embodiments described herein relate to a resistive memory device, a resistive memory system, and a method for operating a resistive memory device.

2. Background

Non-volatile memory devices do not have to be refreshed and generally has a high storage capacity and low power consumption. Examples of non-volatile memory devices include a dynamic random access memory (DRAM), a non-volatile flash memory, and a high speed static RAM (SRAM).

Attempts to increase the integration of these devices continues to be made. Recent research has focused on the development of phase change RAM (PRAM), nano floating gate memory (NFGM), polymer RAM (PoRAM), magnetic RAM (MRAM), ferroelectric RAM (FeRAM), and resistive RAM (RRAM) to name a few.

SUMMARY

In accordance with one or more embodiments, a method of operating a resistive memory device includes sensing a temperature of the resistive memory device; setting a level of a set voltage or current for writing to a memory cell based on the temperature; setting a level of a reset voltage for reset writing to the memory cell based on the temperature; and performing a write operation on the memory cell based on the level of the set voltage or current and the level of the reset voltage. In set writing, a resistance value of the memory cell may vary according to the level of the set current flowing in the memory cell, and in the reset writing the resistance value of the memory cell may vary according to the level of the reset voltage applied to the memory cell.

The method may include adjusting the level of the set voltage and/or the level of the reset voltage based on the temperature and a first control signal, and adjusting the level of the set current based on the temperature and a second control signal.

The method may include decreasing the level of the reset voltage when the temperature increases and increasing the level of the reset voltage when the temperature decreases. The method may include decreasing the level of the set current when the temperature increases and increasing the level of the set current when the temperature decreases. The method may include adjusting the level of the set voltage to maintain a substantially constant value when the temperature changes. The method may include adjusting the level of the set current to maintain a substantially constant value when the temperature changes.

Performing the write operation on the memory cell may include performing a set write operation on a first tile of the resistive memory device based on a level-adjusted set voltage or set current; and performing a reset write operation on a second tile of the resistive memory device based on a level-adjusted reset voltage. The set write operation and the reset write operation may be simultaneously performed.

The method may include generating a first sensing signal indicating that the temperature is decreased compared to a normal state, or generating a second sensing signal indicating that the temperature is increased compared to the normal state, and setting a write condition in a hot state or a write condition in a cold state based on the first sensing signal or the second sensing signal. The method may include adjusting levels of the set voltage, the set current, and the reset voltage to perform the write operation at a first operating voltage when the write condition is set in the hot state, and adjusting the levels of the set voltage, the set current, and the reset voltage to perform the write operation at a second operating voltage when the write condition is set in the cold state, the second operating voltage greater than the first operating voltage.

In accordance with one or more other embodiments, a resistive memory device includes a memory cell array including a plurality of memory cells; a power generator to provide a set voltage and a reset voltage; a current controller to adjust a level of a set current; a temperature sensor to sense a temperature of the memory cell array; and control logic to control a write operation for the memory cells based on the set current or voltage and the reset voltage, wherein the current controller is to adjust the level of the set current for set writing to the memory cells based on the temperature and wherein the control logic is to adjust a level of a reset voltage for reset writing to the memory cells based on the temperature.

The control logic may generate a first control signal to control the power generator and a second control signal to control the current controller based on the temperature. The current controller may decrease the level of the set current when the temperature increases and increase the level of the set current when the temperature decreases. The control logic may decrease the level of the reset voltage when temperature increases and increase the level of the reset voltage when the temperature decreases.

In accordance with one or more other embodiments, an apparatus includes an interface; and control logic to receive signals from or output signals to the interface, wherein the control logic is to control a write operation for a memory cell based on a set current or voltage and a reset voltage, and wherein the control logic is to adjust a level of the set current or voltage for set writing to the memory cell and a level of a reset voltage for reset writing to the memory cell based on a temperature of a memory device including the memory cell.

The control logic may decrease the level of the set current when the temperature increases, and increase the level of the set current when the temperature decreases. The control logic may decrease the level of the reset voltage when the temperature increases, and increase the level of the reset voltage when the temperature decreases. The control logic may adjust the level of the set voltage to maintain a substantially constant value when the temperature changes. The control logic may adjust the level of the set current to maintain a substantially constant value when the temperature changes.

BRIEF DESCRIPTION OF THE DRAWINGS

Features will become apparent to those of skill in the art by describing in detail example embodiments with reference to the attached drawings in which.

DETAILED DESCRIPTION

Figure 1:
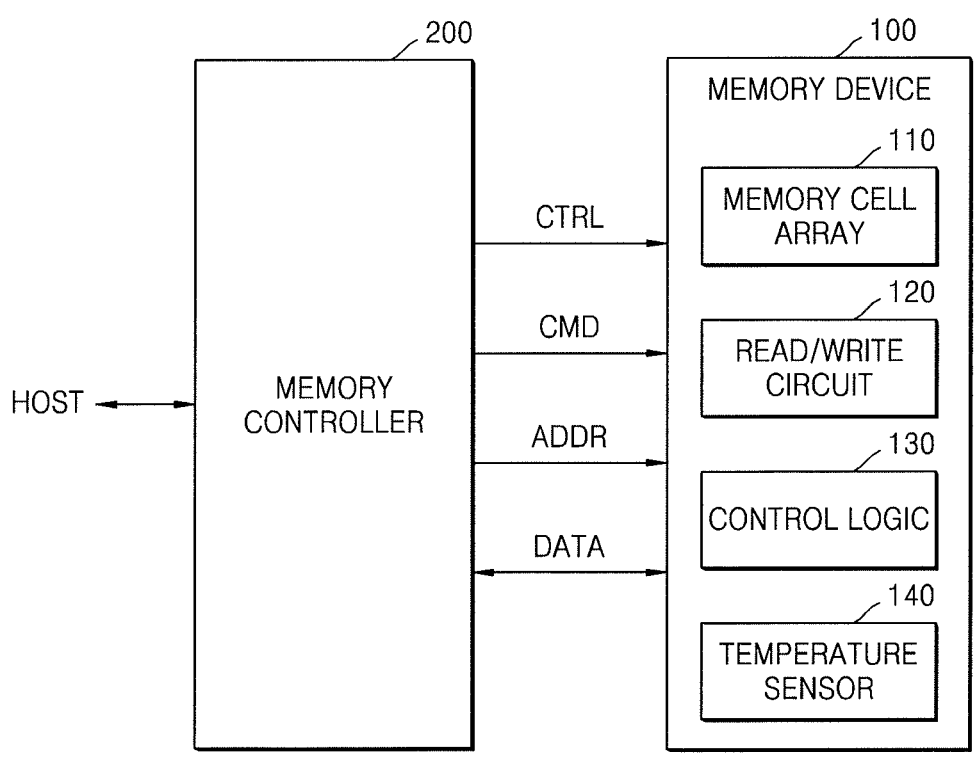
FIG. 1 illustrates an embodiment of a memory system.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. One or more embodiments may be combined to form additional embodiments. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

Terms used in the present specification are used for explaining a specific example embodiment, not for limiting the present inventive concept. Thus, an expression used in a singular form in the present specification also includes the expression in its plural form unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the present inventive concept, a first constituent element may be referred to as a second constituent element, and vice versa.

Unless defined otherwise, all terms used herein including technical or scientific terms have the same meanings as those generally understood by those of ordinary skill in the art to which the present inventive concept may pertain. The terms as those defined in generally used dictionaries are construed to have meanings matching that in the context of related technology and, unless clearly defined otherwise, are not construed to be ideally or excessively formal.

FIG. 1 illustrates an embodiment of a memory system 10 which includes a memory device 100. In the present example embodiment, the memory device 100 includes resistive memory cells and thus may be referred to as a resistive memory device. In another embodiment, the memory device 100 may include another type of memory cells. Also, the memory cells may be arranged at regions where a plurality of first signal lines and a plurality of second signal lines intersect. Accordingly, the memory device 100 may be referred to as a cross-point memory device in at least one embodiment.

Referring to FIG. 1, the memory system 10 a memory controller 200 connected to the memory device 100. The memory device 100 includes a memory cell array 110, a read/write circuit 120, a control logic 130, and a temperature sensor 140. When the memory cell array 110 includes resistive memory cells, the memory system 10 may be referred to be a resistive memory system 10.

Based on a write/read request from a host, the memory controller 200 may control the memory device 100 to read data stored in the memory device 100 or write data to the memory device 100. For example, the memory controller 200 may control programming (or writing), reading, and erasing operations for the memory device 100 by providing the memory device 100 with address (ADDR), command (CMD), and control signal (CTRL). Also, data to be written (DATA) and read data (DATA) may be transceived between the memory controller 200 and the memory device 100.

In one example embodiment, the memory controller 200 may include RAM, a processing unit, a host interface, and a memory interface. The RAM may be used as an operation memory of the processing unit. The processing unit may control operation of the memory controller 200. The host interface may perform data exchange between the host and the memory controller 200 based on one or more predetermined protocols. For example, the memory controller 200 may communicate with an external device HOST based on interface protocols that include but are not limited to universal serial bus (USB), multi-media card (MMC), peripheral component interconnect express (PCI-E), advanced technology attachment (ATA), Serial-ATA, Parallel-ATA, small computer system interface (SCSI), enhanced small disk interface (ESDI), and integrated drive electronics (IDE).

The memory cell array 110 may include a plurality of memory cells arranged at the regions where the first signal lines and the second signal lines intersect. In one example embodiment, the first signal lines may be a plurality of bit lines and the second signal lines may be a plurality of words lines. In another example embodiment, the first signal lines may be a plurality of word lines and the second signal lines may be a plurality of bit lines.

Also, each of the memory cells may be a single-level cell (SLC) where one bit of data is stored or a multi-level cell (MLC) where at least two bits of data are stored. In another embodiment, the memory cell array 110 may include an SLC and an MLC. When one bit of data is written to one memory cell, the memory cells may have two resistance level distributions according to the written data. In another embodiment, when two bits of data are written to one memory cell, the memory cells may have four resistance level distributions according to the written data. In another example embodiment, when three bits of data are written to one memory cell (e.g., a triple level cell (TLC)), the memory cells may have eight resistance level distributions according to the written data. In another embodiment, the memory cells each may store four or more bits of data.

Also, in one example embodiment, the memory cell array 110 may include memory cells in a two-dimensional horizontal structure. In another example embodiment, the memory cell array 110 may include memory cells in a three-dimensional vertical structure.

In another example embodiment, the memory cell array 110 may include resistive memory cells having variable resistance devices. For example, when the variable resistance device includes phase change material such as germanium-antimony-tellurium (GST or Ge—Sb—Te) and thus resistance changes according to temperature, the resistive memory device may be PRAM. In another example, when the variable resistance device includes a complex metal oxide between an upper electrode and a lower electrode, the resistive memory device may be RRAM. In another example, when the variable resistance device includes a dielectric material between a magnetic upper electrode and a magnetic lower electrode, the resistive memory device may be MRAM.

The read/write circuit 120 performs read and write operations with respect to the memory cells. The read/write circuit 120 may be connected to the memory cells via a plurality of bit lines and may include a write driver to write data to the memory cells and a sense amplifier for sensing resistance components of the memory cells.

The control logic 130 may control the overall operation of the memory device 100, and may also control the read/write circuit 120 to perform memory operations such as writing and reading. In one example embodiment, the memory device 100 includes a power generator for generating various write voltages and read voltages to be used for read and write operations. Levels of the write voltage and the read voltage may be adjusted by the control logic 130. The read/write circuit 120 may receive the write voltage and the read voltage and may provide the received write and read voltages to the memory cell array 110.

In the write operation of the memory device 100, a resistance value of a variable resistor of a memory cell of the memory cell array 110 may increase or decrease according to write data. For example, each of the memory cells of the memory cell array 110 may have a resistance value according to currently stored data, and the resistance value may increase or decrease according to data to be written to each memory cell.

The write operation may be classified into a reset write operation and a set write operation. In a resistive memory cell, a set state may have a relatively low resistance value, whereas a reset state may have a relatively high resistance value. While the reset write operation may perform a write operation in a direction in which the resistance value of the variable resistor increases, the set write operation may perform a write operation in a direction in which the resistance value of the variable resistor decreases.

According to the present example embodiment, the temperature sensor 140 senses temperature within the memory device 100 and generates a sense signal. Also, a write condition to the memory cell array 110 is set to be different according to a result of the sensing of temperature. For example, levels of a set voltage and/or a set current used for the set write operation are adjusted and also a level of a reset voltage used for the reset write operation may be adjusted.

In an example embodiment, for the set write operation, the resistance value may be varied by the level of the set current flowing in the memory cell. For the reset write operation, the resistance value may be varied by the level of the set voltage applied to the memory cell. The set write operation may be performed on the memory cell by the set current having a level adjusted according to the result of the temperature sensing. Also, the reset write operation may be performed on the memory cell by the reset current having a level adjusted according to the result of the temperature sensing.

According to the above operation, compensation for a change of temperature may be performed in the resistive memory device in which data is stored according to a change in resistance. Even when the characteristics of a memory cell are changed according to temperature, data may be stably written. Also, when factors for determining the resistance value in the set write operation and the reset write operation are different from each other, the write operation is performed according to the set current and the reset voltage whose levels are adjusted according to the result of the temperature sensing. Thus, compensation for the change of temperature may be performed with respect to each of the set write operation and the reset write operation.

In another embodiment, the memory controller 200 and the memory device 100 may be integrated as one semiconductor device. For example, the memory controller 200 and the memory device 100 may be integrated as one semiconductor device forming a memory card, e.g., a PC card (PCMCIA), a compact flash card (CF), a smart media card (SM/SMC), a memory stick, a multimedia card (MMC, RS-MMC, or MMCmicro), an SD card (SD, miniSD, or microSD), a universal flash memory (UFS), etc. In another example, the memory controller 200 and the memory device 100 may be integrated as one semiconductor device forming a solid state disk/drive (SSD). An example of a detailed operation of the memory device 100 in the resistive memory system 10 configured as above is discussed as follows.

Figure 2:
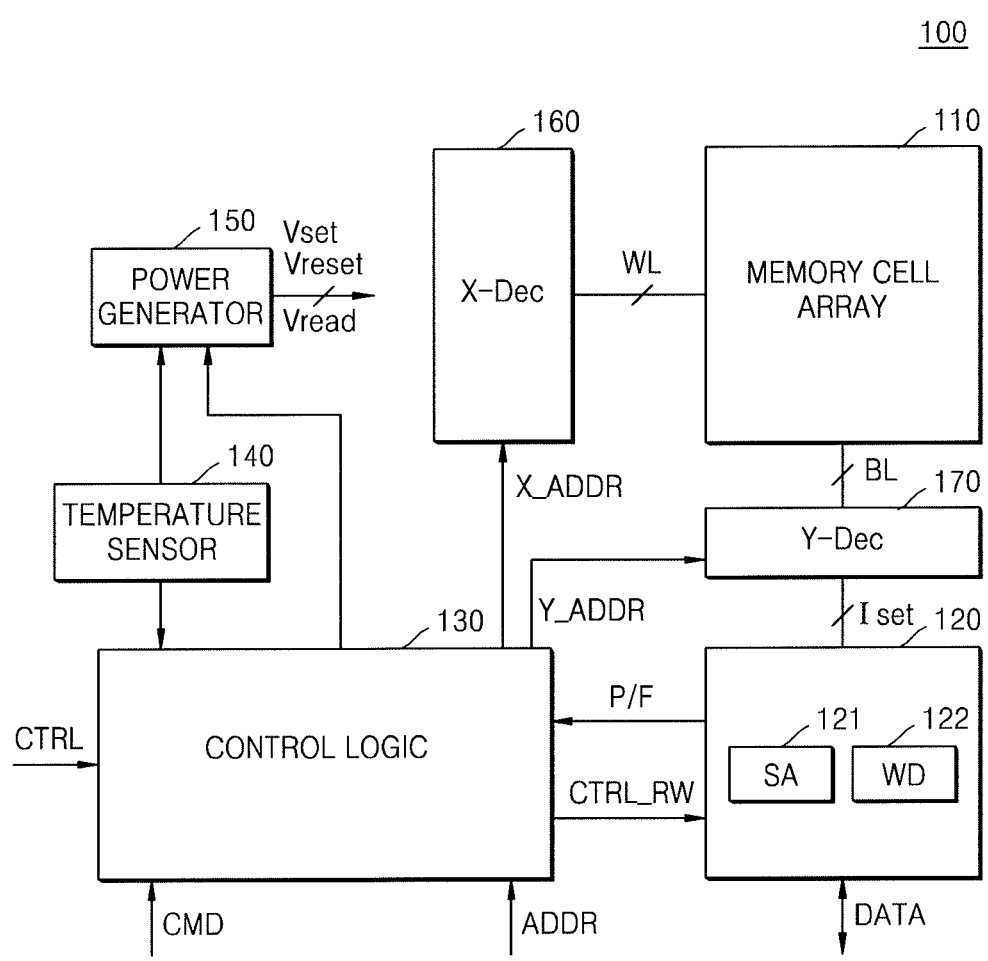
FIG. 2 illustrates an embodiment of a memory device.

FIG. 2 illustrates an embodiment of the memory device 100 of FIG. 1. Referring to FIG. 2, the memory device 100 may include the memory cell array 110, the read/write circuit 120, the control logic 130, and the temperature sensor 140. The memory device 100 may also include a power generator 150, a row decoder 160, and a column decoder 170. The read/write circuit 120 may include a sense amplifier 121 and a write driver 122.

An example of an operation of the memory device 100 of FIG. 2 is described as follows. Memory cells in the memory cell array 110 may be connected to a plurality of first signal lines and a plurality of second signal lines. The first signal lines may be bit lines BL and the second signal lines may be word lines WL. Because various voltage signals or current signals are provided through the bit lines BL and the word lines WL, data may be read from or written to selected memory cells and data reading or writing on the other non-selected memory cells may be prevented.

In another embodiment, an address ADDR indicating a memory cell to access may be received with a command CMD. The address ADDR may include a row address X_ADDR to select the word line WL of the memory cell array 110 and a column address Y_ADDR to select the bit line BL of the memory cell array 110. The row decoder 160 performs a word line selection operation based on the row address X_ADDR. The column decoder 170 performs a bit line selection operation based on the column address Y_ADDR.

The read/write circuit 120 is connected to the bit lines BL and may write data to the memory cell or may read data from the memory cell. For example, at least part of a voltage signal or a current signal may be provided to the memory cell array 110 through the read/write circuit 120. In an example embodiment, when the memory operation is performed in a uni-polar method, a set voltage Vset and a reset voltage Vreset may be provided to the memory cell through the read/write circuit 120. In another example embodiment, when the memory operation is performed in a bi-polar method, the reset voltage Vreset may be provided to the memory cell through the row decoder 160. Also, a read voltage Vread may be provided to the read/write circuit 120 and used for the read operation. Also, the read/write circuit 120 may include a current source used for the write operation with respect to the memory cell. For example, the write driver 122 may include, as a current controller, a current source that may adjust the level of a current based on a control signal.

In another embodiment, during the data read operation, the read/write circuit 120 may include a comparator connected to one node (e.g., a sensing node) of the bit line BL to determine data, and may read a data value through a comparison operation to a sensing voltage or a sensing current of the sensing node. A reference voltage and/or a reference current used for the determination of data may be generated by the power generator 150 or by other voltage source or current source.

Also, the read/write circuit 120 may provide a pass/fail P/F signal, according to a result of the determination of read data, to the control logic 130. The control logic 130 may control the read and write operations of the memory cell array 110 by referring to the pass/fail P/F signal.

The control logic 130 may output various control signals CTRL_RW to write data to the memory cell array 110 or read data from the memory cell array 110 based on the command CMD, the address ADDR, and the control signal CTRL from the memory controller 200. Accordingly, the control logic 130 may control various operations of the memory device 100.

According to the present example embodiment, the levels of the set voltage Vset and the reset voltage Vreset may be adjusted based on a temperature sensed by the temperature sensor 140. In an example, a sensing signal from the temperature sensor 140 may be provided to the control logic 130, and the control logic 130 may provide a control signal (e.g., a voltage control signal), to adjust the levels of the set voltage Vset and the reset voltage Vreset, to the power generator 150. In another example embodiment, the sensing signal from the temperature sensor 140 is provided directly to the power generator 150, and the levels of the set voltage Vset and the reset voltage Vreset may be adjusted accordingly.

In another example embodiment, the level of a set current Iset may be adjusted according to the sensing signal from the temperature sensor 140. In an example, when a control signal (e.g., a current control signal) generated based on a sensed temperature is provided to the current controller, the current controller may adjust the level of the set current Iset applied to the memory cell. As described above, when the current controller is provided as a current source in the write driver 122, the control signal (e.g., a current control signal) may be provided to the write driver 122.

The levels of the set voltage Vset, the reset voltage Vreset, and the set current Iset may be adjusted in various ways according to a change of temperature. In an example embodiment, in the reset write operation, when the temperature of the memory device 100 increases, the level of the reset voltage Vreset may be adjusted to decrease. When the temperature of the memory device 100 decreases, the level of the reset voltage Vreset may be adjusted to increase.

Also, in an example embodiment, in the set write operation, when the temperature of the memory device 100 increases, the level of the set current Iset may be adjusted to decrease. When the temperature of the memory device 100 decreases, the level of the set current Iset may be adjusted to increase.

Also, in an example embodiment, in the set write operation, regardless of the increase or decrease of the temperature of the memory device 100, the level of the set current Iset may be adjusted such that the set current Iset having a constant level may be applied to the memory cell.

In another example embodiment, in the set write operation, the set voltage Vset may be set to have a relatively high level over a predetermined level regardless of an increase or decrease of the temperature of the memory device 100.

In another example embodiment, in the set write operation, when the temperature of the memory device 100 increases, the level of the set voltage Vset is adjusted to decrease. When the temperature of the memory device 100 decreases, the level of the set voltage Vset is adjusted to increase.

As described above, a writing condition may be set by combining the adjustments of the levels of the reset voltage Vreset, the set voltage Vset, and the set current Iset. As the writing condition varies according to a change of temperature, compensation may be performed corresponding to the change of temperature.

Figure 3:
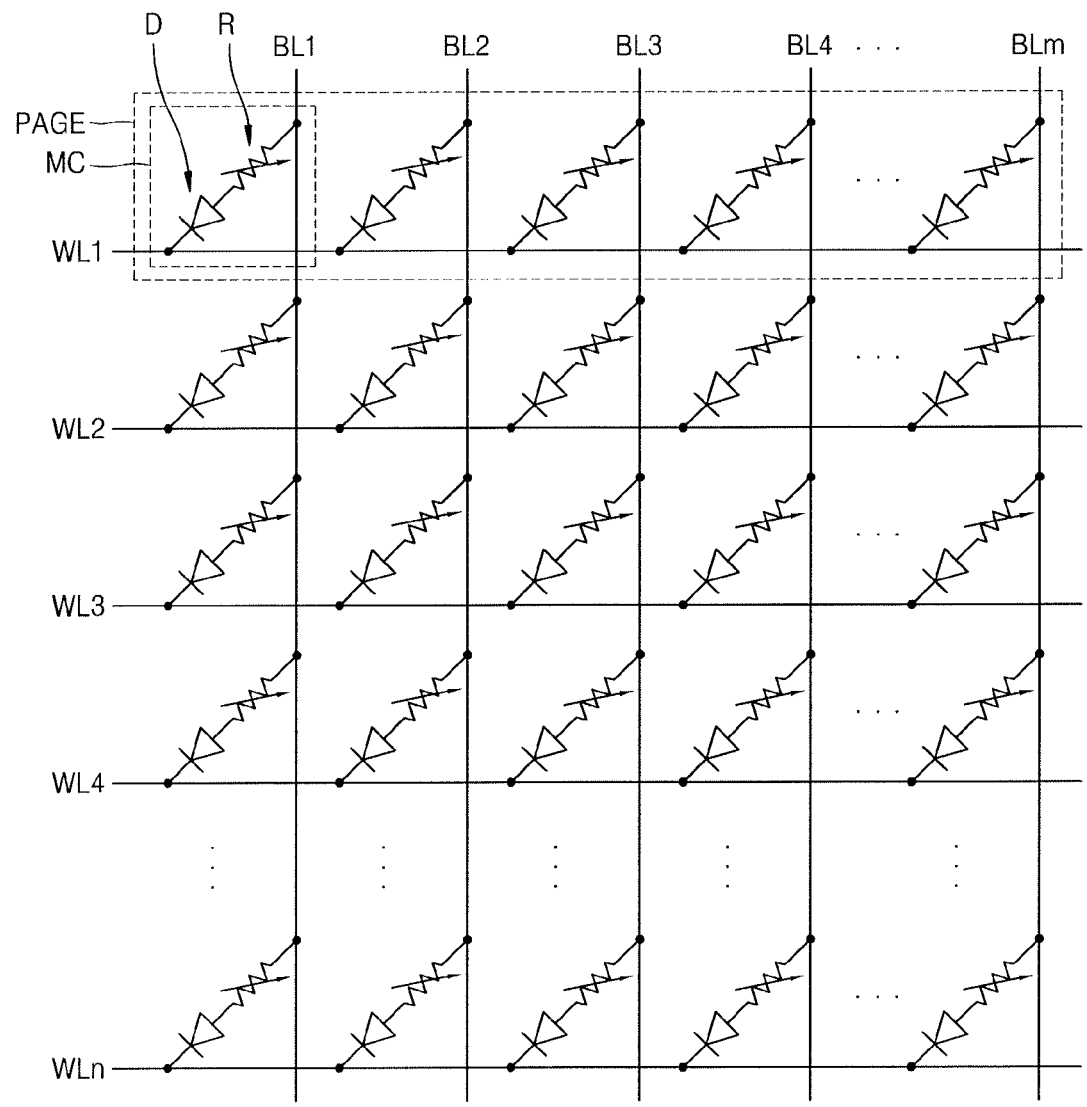
FIG. 3 illustrates an embodiment of a memory cell array.

FIG. 3 illustrates an embodiment of memory cell array 110 in FIG. 2. The memory cell array 110 may include a plurality of cell blocks, and FIG. 3 illustrates an example of one of the cell blocks in detail.

Referring to FIG. 3, the memory cell array 110 includes a plurality of word lines WL1-WLn, a plurality of bit lines BL1-BLm, and a plurality of memory cells MC. The number of the word lines WL, the number of the bit lines BL, and the number of the memory cells MC may be different in other embodiments. Also, in one example embodiment, the memory cells MC connected to the same word line WL may be defined for each page.

Each memory cell MC includes a variable resistor R and a selective device D. The variable resistor R may be referred to as a variable resistance device or a variable resistor material, and the selective device D may be referred to as a switching device.

In one example embodiment, the variable resistor R may be connected between one of the bit lines BL1-BLm and the selective device D. The selective device D may be connected between the variable resistor R and one of the word lines WL1-WLn. In another example embodiment, the selective device D may be connected between one of the bit lines BL1-BLm and the variable resistor R, and the variable resistor R may be connected between the selective device D and one of the word lines WL1-WLn.

The variable resistor R may vary to correspond to one of a plurality of resistance states by an applied electric pulse. In one example embodiment, the variable resistor R may include a phase-change material having a crystal state that changes according to an amount of current. Examples of the phase-change material include two-element compounds such as GaSb, InSb, InSe, $Sb_2Te_3$, and GeTe, three-element compounds such as GeSbTe, GaSeTe, InSbTe, $SnSb_2Te_4$, and InSbGe, four-element compounds such as AgInSbTe, (GeSn)SbTe, GeSb(SeTe), and $Te_{81}Ge_{15}Sb_2S_2$.

The phase-change material may have an amorphous state having a relatively high resistance and a crystal state having a relatively low resistance. The phase-change material may have a phase that changes according to Joule's heat generated according to an amount of current. Accordingly, data may be written by using the phase change.

In another example embodiment, the variable resistor R may include perovskite compounds, transition metal oxides, magnetic materials, ferromagnetic materials, or antiferromagnetic materials instead of a phase-change material.

The selective device D may be connected between one of the word lines WL1~WLn and the variable resistor R and may control supply of current to the variable resistor R according to the voltage applied to the connected word line and bit line. In one example embodiment, the selective device D may be a PN junction diode or a PIN junction diode. An anode of the diode may be connected to the variable resistor R and a cathode of the diode may be connected to one of the word lines WL1~WLn. When a voltage difference between the anode and the cathode of the diode is higher than a critical voltage of the diode, the diode may be turned on to supply current to the variable resistor R.

Figure 4A:
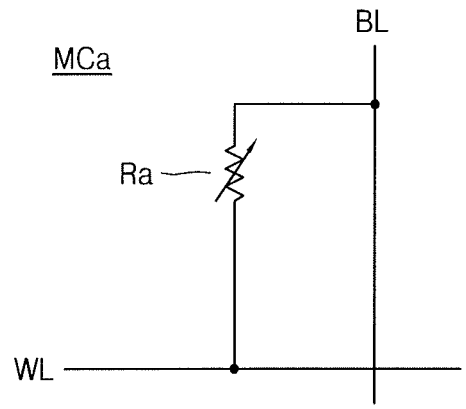
FIGS. 4A to 4C illustrate embodiments of memory cells.
Figure 4B:
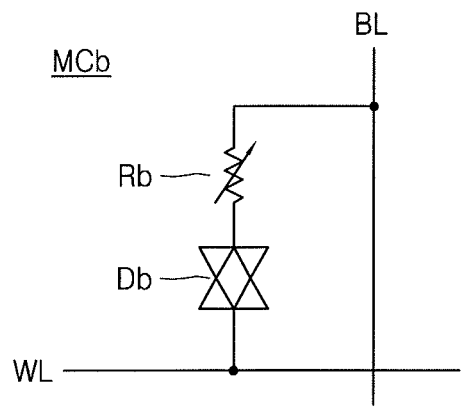
Figure 4C:
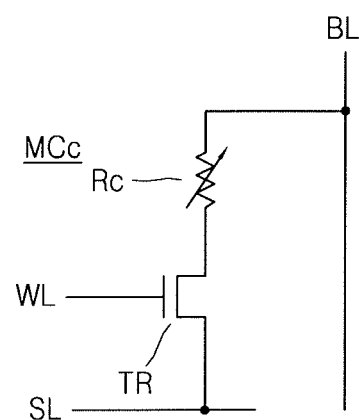

FIGS. 4A to 4C illustrate additional embodiments of the memory cell MC of FIG. 3. Referring to FIG. 4A, a memory cell MCa includes a variable resistor Ra connected between a bit line BL and a word line WL. The memory cell MCa may store data based on the voltages applied to the bit line BL and the word line WL.

Referring to FIG. 4B, a memory cell MCb includes a variable resistor Rb and a bidirectional diode Db. The variable resistor Rb includes a resistive material for storing data. The bidirectional diode Db is connected between the variable resistor Rb and the word line WL, and the variable resistor Rb is connected between the bit line BL and the bidirectional diode Db. The positions of the bidirectional diode Db and the variable resistor Rb may be switched with each other in another embodiment. The bidirectional diode Db may block leakage current flowing through a non-selective resistance cell.

Referring to FIG. 4C, a memory cell MCc includes a variable resistor Rc and a transistor TR. The transistor TR may be a selective device (e.g., a switching device) that allows or blocks supply of current to the variable resistor Rc according to the voltage of the word line WL. In the example embodiment of FIG. 4C, in addition to the word line WL, a source line SL may be provided to adjust voltage levels at the opposite ends of the variable resistor Rc. The transistor TR is connected between the variable resistor Rc and the source line SL, and the variable resistor R is connected between the bit line BL and the transistor TR. The positions of the transistor TR and the variable resistor Rc may be switched with each other in another embodiment. The memory cell MCc may or may not be selected according to turning on or off of the transistor TR that is driven by the word line WL.

Figure 5:
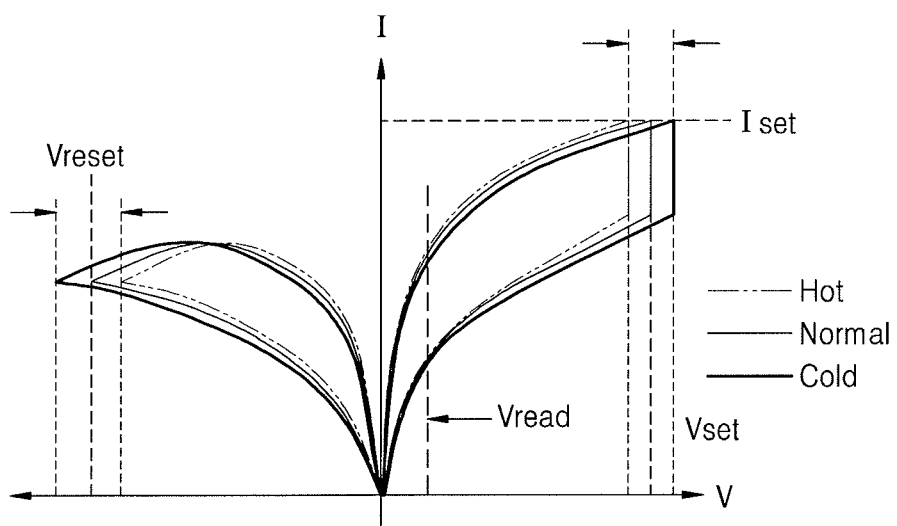
FIG. 5 illustrates an example of a voltage-current curve of a memory cell.

FIG. 5 illustrates a graph showing an example of a voltage-current characteristic curve of the memory cell MC according to a change of temperature. A normal state, a hot state, and a cold state are presented as examples of temperatures. Also, for convenience of explanation, a case in which the memory cell MC corresponds to a single level cell is described.

Referring to FIG. 5, the horizontal axis denotes a voltage V and the vertical axis denotes current I. The memory cell MC has a high resistance state HRS or a low resistance state LRS according to the stored data. The set write operation may change the memory cell MC from HRS to LRS. The resistance state may be changed by the set current Iset applied to the memory cell MC. For example, when a level of the set current Iset increases, the resistance value of LRS may decrease. When the level of the set current Iset decreases, the resistance value of LRS may increase.

In another embodiment, the reset write operation may change the memory cell MC from LRS to HRS. The resistance state may be changed by the reset voltage Vreset applied to the memory cell MC. For example, when a level of the reset voltage Vreset increases, a resistance value of HRS may increase. When the level of the reset voltage Vreset decreases, the resistance value of HRS may decrease.

In another embodiment, the properties of a memory cell may change as temperature changes. For example, as illustrated in FIG. 5, when temperature increases, an operating voltage for a writing operation may decrease. When temperature decreases, the operating voltage for a writing operation may increase. Accordingly, in the reset write operation, at high temperature, the resistance state of the memory cell MC may be changed to HRS by the reset voltage Vreset having a relatively low level. In contrast, at low temperature, the resistance state of the memory cell MC may be changed to HRS by the reset voltage Vreset having a relatively high level.

In another embodiment, in the set write operation, as the set voltage Vset is applied to the memory cell MC, the level of the set current Iset flowing in the memory cell MC may be adjusted by the current controller connected to one end of the memory cell MC. Since the resistance value of the memory cell MC may be changed by the level of the set current Iset, the level of the set current Iset is adjusted based on the change of temperature to allow the set current Iset to flow through the memory cell MC.

In another embodiment, for the set voltage Vset, a set voltage Vset having a relatively high level may be applied to (or may control) the memory cell MC so that a write operation may be available at all temperatures regardless of a temperature change.

In another example embodiment, a set voltage Vset having a different level according to the change of temperature may be applied to (or may control) the memory cell MC. For example, the level of the set voltage Vset may be compensated according to the change of temperature. For example, when temperature is high, a set voltage Vset having a low level may be applied to the memory cell MC. When temperature is low, a set voltage Vset having a high level may be applied to the memory cell MC.

Figure 6:
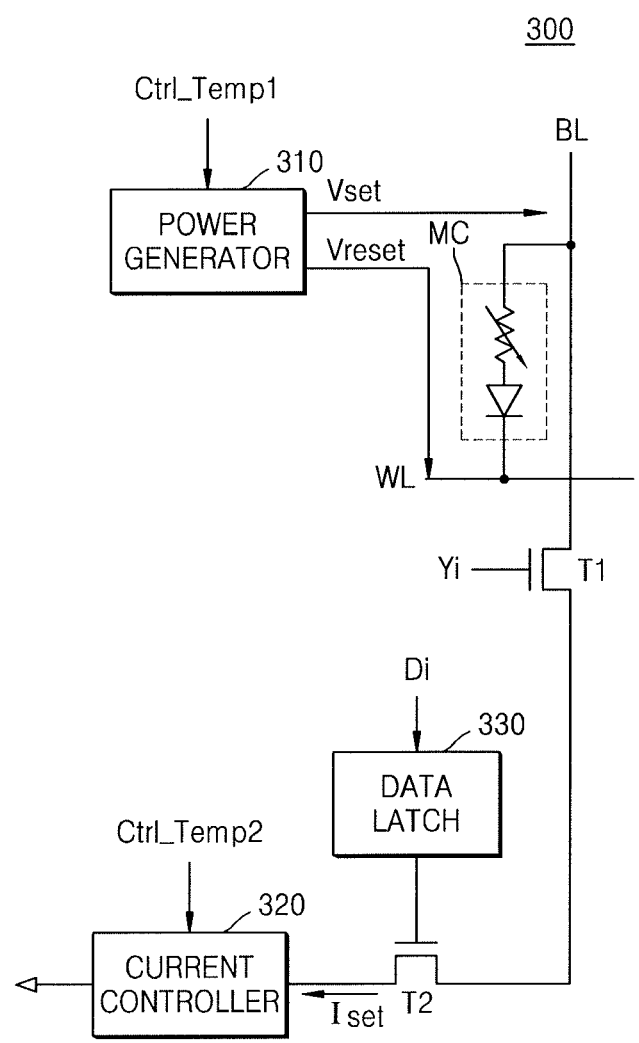
FIG. 6 illustrates an embodiment of a data write circuit.

FIG. 6 illustrates a block diagram of a data write circuit 300 according to an example embodiment. The data write circuit 300 may include or be connected to, for example, various peripheral circuits to perform a write operation on a memory cell. For example, the data write circuit 300 may include a power generator 310 for generating the set voltage Vset and the reset voltage Vreset applied to the memory cell MC, a current controller 320 for controlling a level of the set current Iset flowing in the memory cell MC, one or more switches T1 and T2, and a data latch 330.

A first switch T1 may be switched by an address (e.g., a column address Yi), and the memory cell MC may be selected according to a switching operation of the first switch T1. A second switch T2 may be switched based on input data Di from a data latch 330. The memory cell MC and a current controller 320 may be electrically connected according to the switching operation of the second switch T2. During the set write operation, a level of the set current Iset flowing in the memory cell MC may be adjusted.

The power generator 310 may adjust the levels of the set voltage Vset and the reset voltage Vreset based on a first control signal Ctrl_Temp1. For example, the first control signal Ctrl_Temp1 may have a value based on a sensed temperature, e.g., based on a signal from a temperature sensor or from control logic generated based on the sensed temperature. Also, the current controller 320 may adjust the level of the set current Iset based on a second control signal Ctrl_Temp2. The second control signal Ctrl_Temp2 may also be provided from a temperature sensor or from control logic.

FIGS. 7 to 10 illustrate examples of adjustments performed for the set voltage Vset, the reset voltage Vreset, and the set current Iset. In particular, FIGS. 7 to 10 are graphs showing examples of levels of a voltage or current based on temperature change according to various embodiments.

Figure 7:
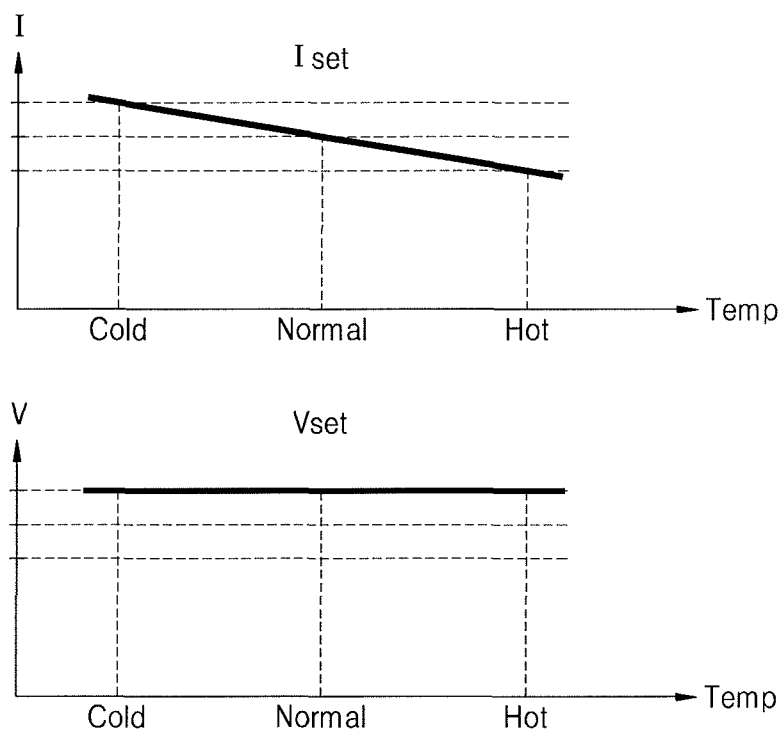
FIGS. 7 to 10 illustrate examples of adjustments based on temperature changes.

As illustrated in FIG. 7, in the set write Write_SET operation, the levels of the set voltage Vset and the set current Iset may be adjusted according to a sensed temperature. In an example embodiment, in order to enable a write operation to the memory cell MC regardless of a change of temperature, the set voltage Vset having a relatively high level may be generated and applied to the memory cell MC. In another embodiment, a resistance valve of the variable resistor in the memory cell MC may vary according to the change of temperature. Accordingly, even when the set current Iset of the same level is applied to the memory cell MC, current having a level higher than that in a normal state may flow in a variable resistor having a lowered resistance value. Thus, when temperature decreases, the level of the set current Iset may be adjusted to increase. Conversely, when temperature increases, the level of the set current Iset may be adjusted to decrease.

Figure 8:
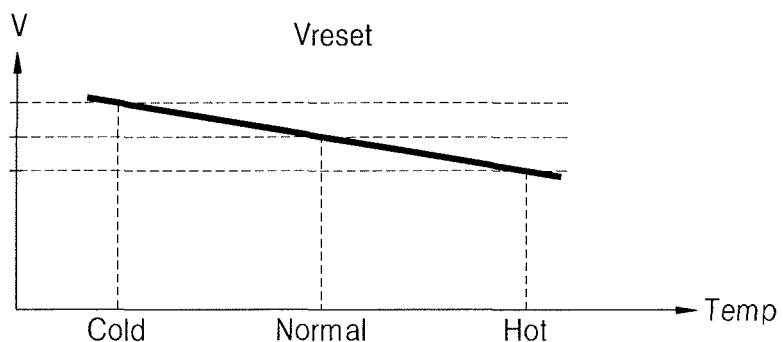

As illustrated in FIG. 8, in the reset write Write_RESET operation, the level of the reset voltage Vreset may be adjusted according to a sensed temperature. For example, as temperature decreases (which corresponds to a cold state), an operating voltage of the reset write Write_RESET may increase. Accordingly, the level of the reset voltage Vreset may be adjusted to increase. In contrast, as temperature increases (which corresponds to a hot state), the operating voltage of the reset write Write_RESET may decrease. Accordingly, the level of the reset voltage Vreset may be adjusted to decrease.

Figure 9:
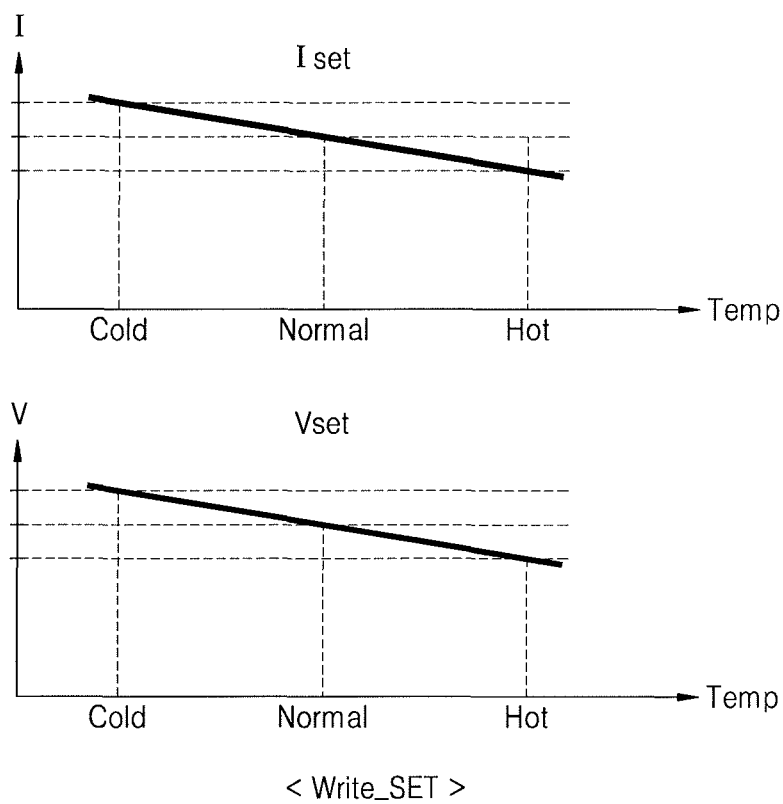

As illustrated in FIG. 9, in the set write Write_SET operation, the level of the set voltage Vset may be adjusted according to a sensed temperature. For example, as temperature decreases (which corresponds to a cold state), an operating voltage of the set write Write_SET may increase. Accordingly, the level of the set voltage Vset may be adjusted to increase. In contrast, as temperature increases (which corresponds to a hot state), the operating voltage of the set write Write_SET may decrease. Accordingly, the level of the set voltage Vset may be adjusted to decrease. In another embodiment, in the set write Write_SET operation, as temperature decreases, the level of the set current Iset may be adjusted to increase. Conversely, as temperature increases, the level of the set current Iset may be adjusted to decrease.

Figure 10:
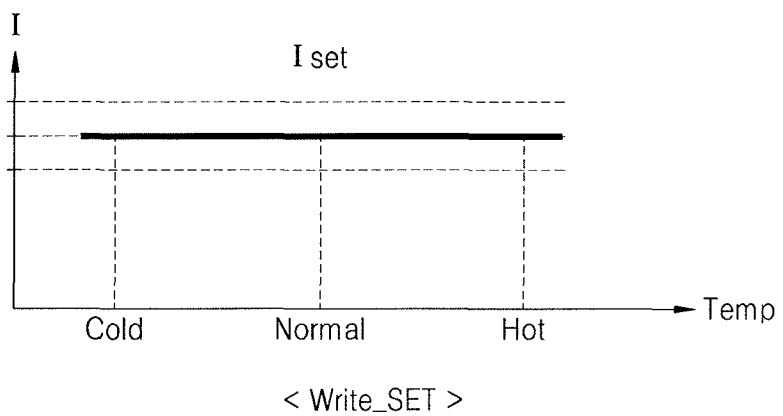

As illustrated in FIG. 10, in the set write Write_SET operation, the set current Iset may be adjusted such that current having a constant level flows in the memory cell MC at all temperatures. For example, although the level of current flowing in the memory cell MC may vary according to a change of temperature, according to the present example embodiment the set current Iset is adjusted to have a constant level at all temperatures. Thus, the amount of change in the resistance value of the memory cell MC based on the change of temperature may be reduced. In this regard, in order to enable a write operation on the memory cell MC regardless of a change of temperature, the set voltage Vset may be applied to have a relatively high level, or the set voltage Vset may be applied having a level adjusted to a different level according to the change of temperature.

Figure 11:
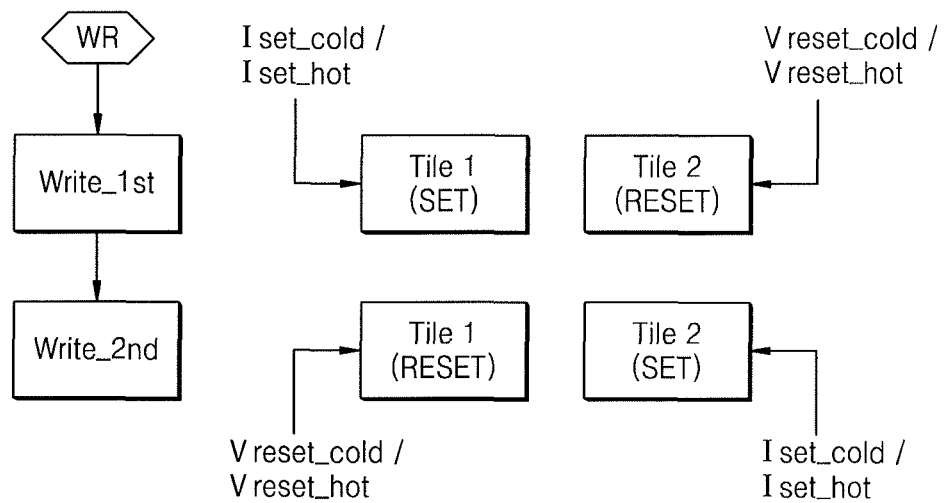
FIG. 11 illustrates an embodiment of a resistive memory device.

FIG. 11 illustrates an example of the operation of the resistive memory device, where the resistive memory device includes a plurality of tiles. In this example, a tile Tile may be defined in various ways. For example, the tile Tile may include a plurality of memory cells, and the word lines connected to the memory cells may share the same row selection block. Also, the bit lines connected to the memory cells may share the same column selection block. Accordingly, the memory cells of a first tile Tile 1 and a second tile Tile 2 may be simultaneously accessed. In one example, while the set write operation is performed in the memory cells of the first tile Tile 1, the reset write operation may be performed in the memory cells of the second tile Tile 2.

In response to receiving a write command WR, the resistive memory device may perform a write operation at least two times. For example, in a first write Write_1st operation, while the set write operation may be performed in the memory cells of the first tile Tile 1, the reset write operation may be performed in the memory cells of the second tile Tile 2. Also, in a second write Write_2nd operation, while the reset write operation may be performed in the memory cells of the first tile Tile 1, the set write operation may be performed in the memory cells of the second tile Tile 2.

Write conditions for the set write operation and the reset write operation may vary based on the temperature by a temperature sensor in the resistive memory device. For example, a temperature increase or decrease may be detected in comparison to the normal state.

For example, when the temperature is detected to decrease, e.g., less than the normal state, a set current Iset_cold having a level that is adjusted to a relatively high level may be provided to the memory cells of the first tile Tile 1 on which the set write operation is to be performed. Also, a reset voltage Vreset_cold having a level that is adjusted to a relatively high level may be provided to the memory cells of the second tile Tile 2 on which the reset write operation is to be performed.

Conversely, when the temperature is detected to be increased, e.g., greater than the normal state, a set current Iset_hot and a reset voltage Vreset_hot having levels that are adjusted to relatively low levels may be provided to each of the memory cells of the first tile Tile 1 and the second tile Tile 2. Next, in the second write Write_2nd operation, based on the change of temperature, a reset voltage Vreset_cold having a relatively high level or a reset voltage Vreset_hot having a relatively low level may be provided to the memory cells of the first tile Tile 1. Also, a set current Iset_cold having a relatively high level or a set current Iset_hot having a relatively low level may be provided to the memory cells of the second tile Tile 2.

According to the example embodiment of FIG. 11, the set voltage having an adjusted level and/or the set current having an adjusted level may be simultaneously provided to the memory cells. Accordingly, even when the factors to determine the resistance value in the set write operation and the reset write operation are different from each other, the set write operation and the reset write operation reflecting temperature compensation may be simultaneously performed.

FIG. 11 illustrates an example in which the levels of the set current Iset_hot and the reset voltage Vreset_hot vary according to the change of temperature. In another embodiment, the levels of the set current, the set voltage, and the reset voltage may be adjusted according to the above-described example embodiments in FIGS. 7 to 10.

Also, in one or more of the above-described example embodiments, a memory operation is performed by a bi-polar method is described. In another embodiment, the memory operation may be performed by a uni-polar method. The levels of the set voltage and the reset voltage applied to the bit lines of the memory cells may be adjusted according to the change of temperature.

Figure 12:
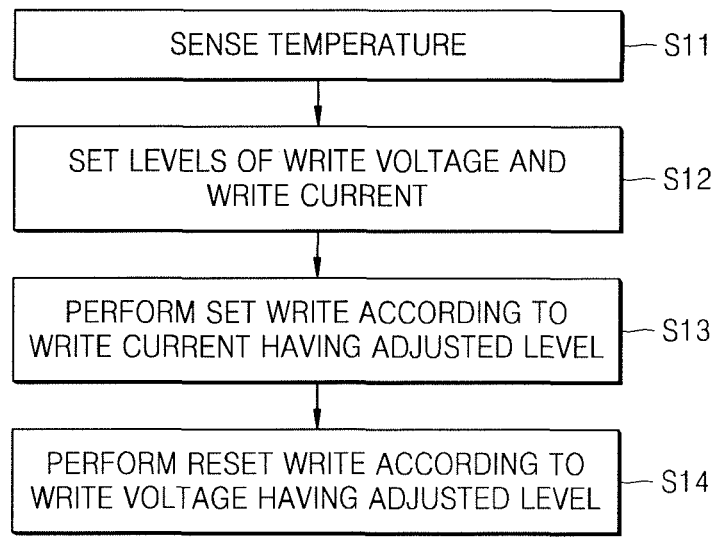
FIG. 12 illustrates an embodiment of a method of operating a memory device.

FIG. 12 illustrates an embodiment of a method for operating the resistive memory device. As illustrated in FIG. 12, the resistive memory device may include a temperature sensor, and the temperature in the resistive memory device is sensed by the temperature sensor (S11). The temperature may be sensed by various methods. For example, the temperature in the resistive memory device may be sensed to be higher or lower than a preset value corresponding to a normal state.

Temperature compensation may be performed in the write operation of the resistive memory device based on the sensed temperature. For example, various write voltages and write currents may be applied to the memory cells in the write operation with respect to the memory cells, and the levels of the write voltage and the write current may be set according to the result of the temperature sensing (S12). When the resistance value of the variable resistor varies according to the level of current flowing in the memory cells in the set write operation, the level of the set current may be adjusted.

Also, when the resistance value of the variable resistor varies according to the level of voltage applied to the memory cells in the reset write operation, the level of the reset voltage may be adjusted. In addition, in the set write operation, the set voltage may be applied to one node connected to the memory cells. Thus, the level of the set voltage may be adjusted.

The write operation on the memory cells is performed according to the write voltage and the write current which may be set as above. For example, in the set write operation, the set write is performed on the memory cells according to the write current having a level adjusted based on the sensed temperature change (S13). In the reset write operation, the reset write is performed on the memory cells according to the write voltage which has a level adjusted based on the sensed temperature change (S14).

The levels of the write voltage and the write current may be adjusted, for example, by applying any of the above-described example embodiments. For example, in performing the reset write operation, when the temperature in the resistive memory device decreases, the write voltage (e.g., the reset voltage) having a high level may be applied to the memory cells. When the temperature in the resistive memory device increases, the write voltage (e.g., the reset voltage) having a low level may be applied to the memory cells. Also, in the performing the set write operation, the write current having a different level according to the change of temperature may be adjusted to flow in the memory cells.

Figure 13:
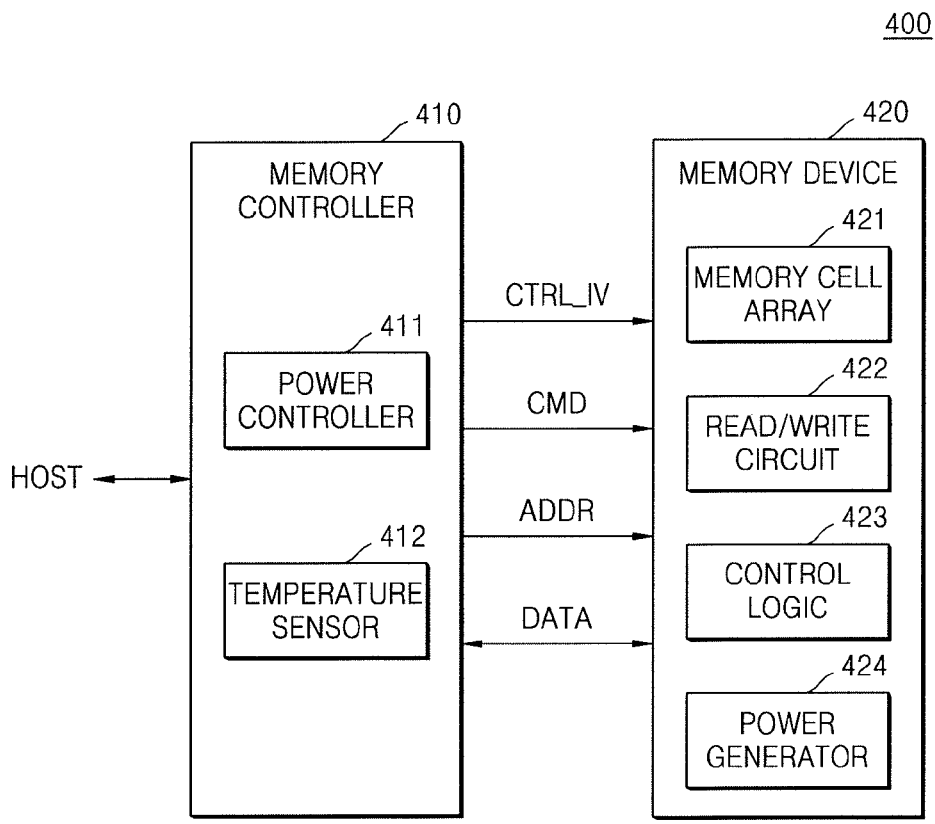
FIG. 13 illustrates another embodiment of a memory system.

FIG. 13 illustrates an embodiment of a memory system 400 including a memory controller 410 and a memory device 420. The memory controller 410 includes a power controller 411 and a temperature sensor 412. Also, the memory device 420 may include a memory cell array 421, a read/write circuit 422, a control logic 423, and a power generator 424. When the memory cell array 421 includes resistive memory cells, the memory system 400 may be referred to as a resistive memory system. The elements in FIG. 13 may be the same as those in FIG. 2 and thus may perform the same or similar operations.

The power controller 411 controls various voltage signals and current signals generated by the memory device 420. In an example, the temperature sensor 412 may sense the temperature in the memory system 400 and may provide a sensing signal to the power controller 411. The power controller 411 may generate a power control signal CTRL_IV to adjust the levels of the various voltage signals and current signals generated by the memory device 420 according to the sensing signal and may provide the power control signal to the memory device 420.

The memory device 420 may perform a memory operation based on the address ADDR and the command CMD from the memory controller 410, or may receive write data DATA from the memory controller 410 or output read data DATA to the memory controller 410. In another embodiment, the power generator 424 may generate various voltage signals having adjusted levels based on the power control signal CTRL_IV. The voltage signals include or be based on, for example, the set voltage and the reset voltage of the memory operation.

Also, in the set write operation, the memory device 420 may include a current source to provide a set current to the memory cells. The current source may be in the read/write circuit 422 or the power generator 424. The current source may generate a set current having an adjusted level based on the power control signal CTRL_IV from the memory controller 410. The levels of the set voltage, the reset voltage, and the set current may be adjusted by employing any one of the above-described embodiments.

Figure 14:
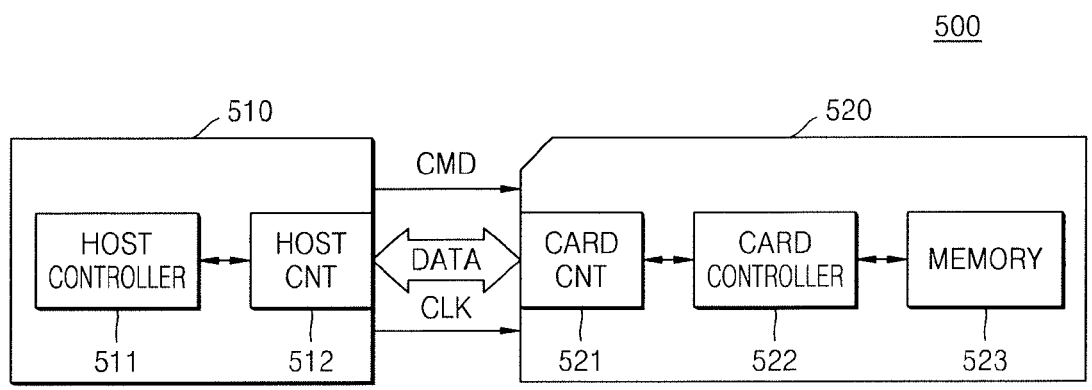
FIG. 14 illustrates an example of applying a memory system to a memory card.

FIG. 14 illustrates an example of applying the memory system according to any one of the above-described example embodiments to a memory card system 500. The memory system is assumed to be a resistive memory system.

Referring to FIG. 14, the memory card system 500 includes a host 510 and a memory card 520. The host 510 includes a host controller 511 and a host connector 512. The memory card 520 includes a card connector 521, a card controller 522, and a memory device 523. The memory device 523 may be embodied by using the example embodiments in any of FIGS. 1 to 13. Accordingly, the memory device 523 may sense temperature in the memory device 523 and may adjust the levels of the write voltage and the write current for a write operation according to the sensed temperature.

The host 510 may write data to the memory card 520 or may read data stored in the memory card 520. The host controller 511 may transmit a command CMD, a clock signal CLK generated by a clock generator in the host 510, and data DATA, to the memory card 520 via the host connector 512.

Based on the command CMD received through the card connector 521, the card controller 522 may control storage of the data DATA in the memory device 523 in synchronism with the clock signal CLK generated by the clock generator in the card controller 522. The memory device 523 stores the data DATA from the host 510.

The memory card 520 may be embodied as, for example, a compact flash card (CFC), a microdrive, a smart media card (SMC), a multimedia card (MMC), a security digital card (SDC), a memory stick, or a USB flash memory driver.

Figure 15:
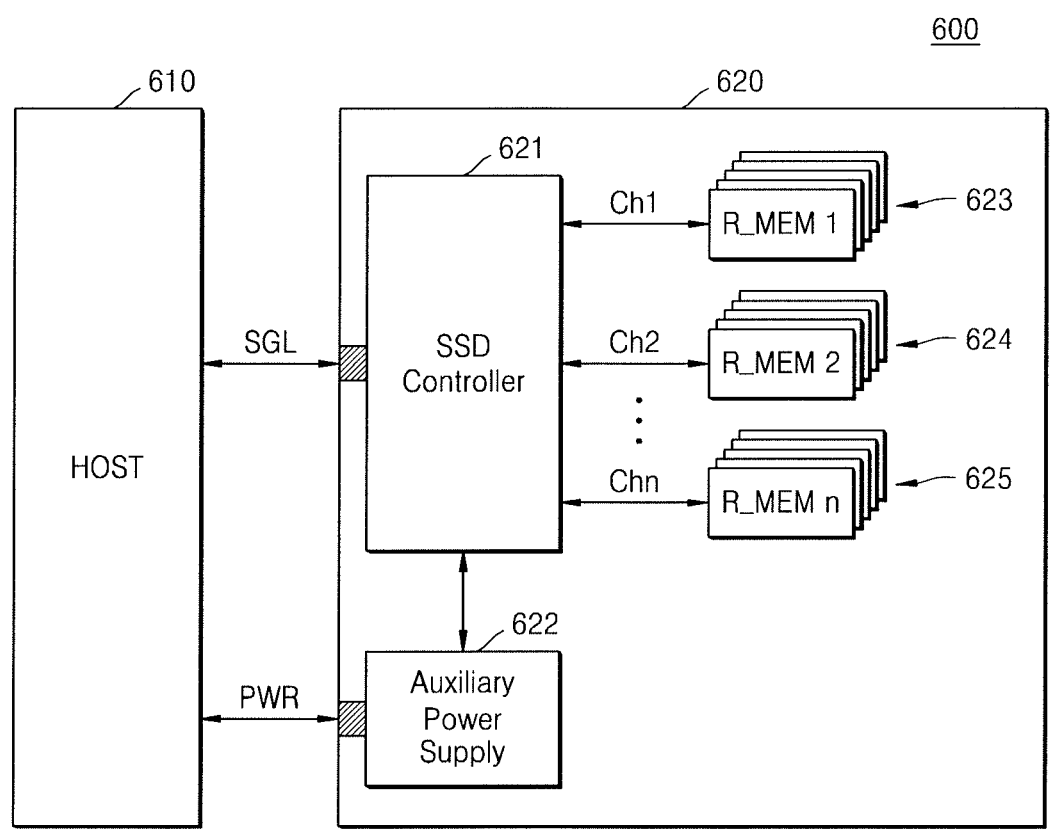
FIG. 15 illustrates an example of applying a memory system to a solid state disk/drive system.

FIG. 15 illustrates an example of applying the memory system according to any one of the above-described example embodiments to a SSD system 600. Referring to FIG. 15, the SSD system 600 includes a host 610 and an SSD 620. The SSD 620 may exchange signals with the host 610 via a signal connector and may receive an input of power through a power connector. The SSD 620 may include an SSD controller 621, an auxiliary power supply 622, and a plurality of memory devices 623, 624, and 625. The SSD 620 may be embodied by using any of the example embodiments in FIGS. 1 to 13. Accordingly, each of the memory devices 623, 624, and 625 may sense temperature in each device and may adjust the levels of the write voltage and the write current to be used for the write operation according to the sensed temperature.

Figure 16:
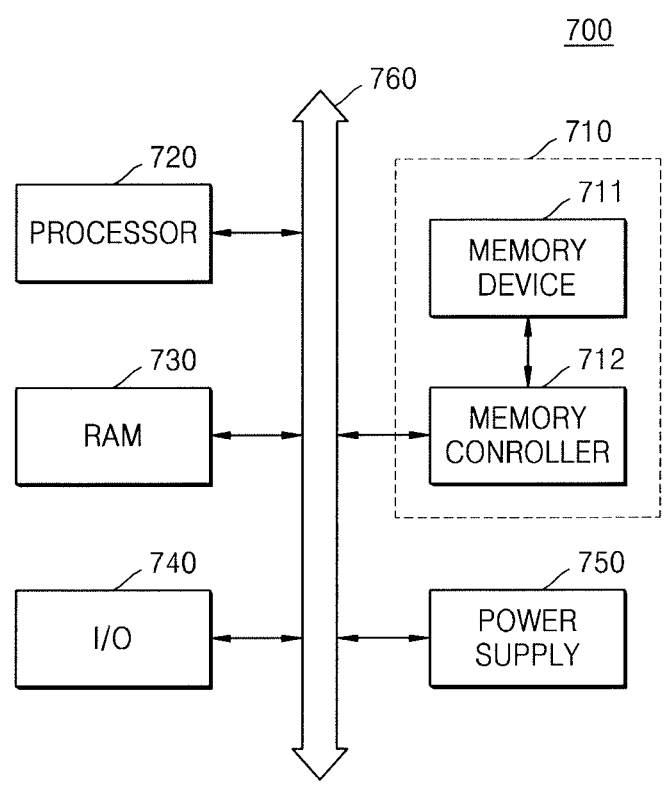
FIG. 16 illustrates an embodiment of a computing system.

FIG. 16 illustrates an embodiment of a computing system 700 including a memory system 710 according to any of the above-described example embodiments. The memory system 710 is assumed to be a resistive memory system.

Referring to FIG. 16, the computing system 700 may include the memory system 710, a processor 720, RAM 730, an input/output (I/O) device 740, and a power supply 750. Also, the memory system 710 may include a memory device 711 and a memory controller 712. Alternatively, although it is not illustrated in FIG. 16, the computing system 700 may further ports that may communicate with a video card, a sound card, a memory card, a USB device, etc. or other electronic devices. The computing system 700 may be embodied by a personal computer or a portable electronic apparatus such as a notebook computer, a mobile phone, a personal digital assistant (PDA), and a camera.

The processor 720 may perform particular calculations or tasks. In some example embodiments, the processor 720 may be a micro-processor or a central processing unit (CPU). The processor 720 may perform communication with the RAM 730, the I/O device 740, and the memory system 710 via a bus 760 such as an address bus, a control bus, and a data bus. The memory system 710 and/or the RAM 730 may be embodied by using the resistive memory device illustrated in FIGS. 1 to 13.

According to an example embodiment, the processor 720 may be connected to an extended bus such as a peripheral component interconnect (PCI) bus.

The RAM 730 may store data needed for the operation of the computing system 700. As described above, the memory device according to the present example embodiment may be employed as the RAM 730. Alternatively, other memories such as DRAM, mobile DRAM, SRAM, PRAM, FRAM, MRAM, etc. may be used as the RAM 730.

The I/O device 740 may include an input device such as a keyboard, a keypad, or a mouse, and an output device such as a printer or a display. The power supply 750 may supply an operating voltage needed for the operation of the computing system 700.

As described above, in the resistive memory device, the resistive memory system, and the method of operating a resistive memory device according to the present inventive concept, since the temperature compensation is performed during the write operation by adjusting the write voltage and the write level according to a change of temperature, write performance may be improved.

Also, the resistive memory device, the resistive memory system, and the method of operating a resistive memory device according to the present inventive concept, even when the factors determining the resistance value during the set write operation and the reset write operation are different from each other, temperature-compensated set write and reset write operations may be simultaneously performed.

In accordance with another embodiment, an apparatus includes an interface and control logic. The control logic receive signals from or output signals to the interface. When the control logic is embodied within an integrated circuit chip, the output may be one or more output terminals, leads, wires, ports, signal lines, or other type of interface without or coupled to the driver. An example of signal lines serving as or included in the interface is set forth, for example, in FIGS. 1, 2, 3, 4A-4C, 6, 11, and 13-16.

The control logic may corresponding to any of the aforementioned embodiments. The signals may include, for example, signals from a temperature sensor received through the interface and/or control signals output from the control logic to control operation of a memory cell array. For example, the control logic may control a write operation for one or more memory cells based on a set current or voltage and a reset voltage as described in accordance with any of the aforementioned embodiments. Also, the control logic may adjust a level of the set current or voltage for set writing to the memory cell and a level of a reset voltage for reset writing to the memory cell based on a temperature of the memory cell array.

The control logic, for example, may include hardware, software, or both. When implemented at least partially in hardware, the control logic may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the control logic may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operation of the apparatus embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A method of operating a resistive memory device, the method comprising:
    sensing a temperature of the resistive memory device;
    setting a level of a set voltage or a set current for writing to a memory cell based on the temperature;
    setting a level of a reset voltage for reset writing to the memory cell based on the temperature; and
    performing a write operation on the memory cell based on the level of the set voltage or the set current and the level of the reset voltage.

2. The method as claimed in claim 1, wherein:
    in the set writing, a resistance value of the memory cell varies according to the level of the set current flowing in the memory cell, and
    in the reset writing, the resistance value of the memory cell varies according to the level of the reset voltage applied to the memory cell.

3. The method as claimed in claim 1, further comprising:
    adjusting at least one of the level of the set voltage or the level of the reset voltage based on the temperature and a first control signal; and
    adjusting the level of the set current based on the temperature and a second control signal.

4. The method as claimed in claim 1, further comprising:
    decreasing the level of the reset voltage when the temperature increases, and
    increasing the level of the reset voltage when the temperature decreases.

5. The method as claimed in claim 1, further comprising:
    decreasing the level of the set current when the temperature increases, and
    increasing the level of the set current when the temperature decreases.

6. The method as claimed in claim 5, further comprising:
    adjusting the level of the set voltage to maintain a substantially constant value when the temperature changes.

7. The method as claimed in claim 1, further comprising:
    adjusting the level of the set current to maintain a substantially constant value when the temperature changes.

8. The method as claimed in claim 1, wherein performing the write operation on the memory cell includes:
    performing a set write operation on a first tile of the resistive memory device based on a level-adjusted set voltage or set current; and
    performing a reset write operation on a second tile of the resistive memory device based on a level-adjusted reset voltage.

9. The method as claimed in claim 8, further comprising performing the set write operation and the reset write operation simultaneously.

10. The method as claimed in claim 1, further comprising:
    generating a first sensing signal indicating that the temperature is less than a normal state, or generating a second sensing signal indicating that the temperature is greater than the normal state, and
    setting a write condition to a cold state or a write condition to a hot state based on the first sensing signal or the second sensing signal, respectively.

11. The method as claimed in claim 10, wherein:
    adjusting levels of the set voltage, the set current, and the reset voltage to perform the write operation at a first operating voltage when the write condition is set to the hot state, and
    adjusting the levels of the set voltage, the set current, and the reset voltage to perform the write operation at a second operating voltage when the write condition is set to the cold state, the second operating voltage greater than the first operating voltage.

12. A resistive memory device, comprising:
    a memory cell array including a plurality of memory cells;
    a power generator to provide a set voltage and a reset voltage;
    a current controller to adjust a level of a set current;
    a temperature sensor to sense a temperature of the memory cell array; and
    control logic to control a write operation for the memory cells based on the set current or voltage and the reset voltage, wherein the current controller is to adjust the level of the set current for set writing to the memory cells based on the temperature and wherein the control logic is to adjust a level of a reset voltage for reset writing to the memory cells based on the temperature.

13. The device as claimed in claim 12, wherein the control logic is to generate a first control signal to control the power generator and a second control signal to control the current controller based on the temperature.

14. The device as claimed in claim 12, wherein the current controller is to:
    decrease the level of the set current when the temperature increases, and
    increase the level of the set current when the temperature decreases.

15. The device as claimed in claim 12, wherein the control logic is to:
    decrease the level of the reset voltage when the temperature increases, and
    increase the level of the reset voltage when the temperature decreases.

16. An apparatus, comprising:
    an interface; and
    control logic to receive signals from or output signals to the interface, wherein the control logic is to control a write operation for a memory cell based on a set current or a set voltage and a reset voltage, and wherein the control logic is to adjust a level of the set current or the set voltage for set writing to the memory cell and a level of a reset voltage for reset writing to the memory cell based on a temperature of a memory device including the memory cell.

17. The apparatus as claimed in claim 16, wherein the control logic is to:
    decrease the level of the set current when the temperature increases, and
    increase the level of the set current when the temperature decreases.

18. The apparatus as claimed in claim 16, wherein the control logic is to:
- decrease the level of the reset voltage when the temperature increases, and
- increase the level of the reset voltage when the temperature decreases.

19. The apparatus as claimed in claim 16, wherein the control logic is to adjust the level of the set voltage to maintain a substantially constant value when the temperature changes.

20. The apparatus as claimed in claim 16, wherein the control logic is to adjust the level of the set current to maintain a substantially constant value when the temperature changes.

* * * * *